(12) United States Patent
Kondo

(10) Patent No.: US 8,004,894 B2
(45) Date of Patent: Aug. 23, 2011

(54) SEMICONDUCTOR INTEGRATED CIRCUIT

(75) Inventor: Hideo Kondo, Gunma (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 407 days.

(21) Appl. No.: 12/238,213

(22) Filed: Sep. 25, 2008

(65) Prior Publication Data

US 2009/0091980 A1    Apr. 9, 2009

(30) Foreign Application Priority Data

Sep. 25, 2007 (JP) ................................ 2007-247593

(51) Int. Cl.
*G11C 16/04* (2006.01)
(52) U.S. Cl. .............................. 365/185.11; 365/185.04
(58) Field of Classification Search ............. 365/185.04, 365/185.11, 230.03, 104
See application file for complete search history.

(56) References Cited

U.S. PATENT DOCUMENTS

| | | | | |
|---|---|---|---|---|
| 6,240,032 | B1 * | 5/2001 | Fukumoto ...................... | 365/222 |
| 7,248,493 | B2 * | 7/2007 | Takashima et al. ............. | 365/145 |
| 7,660,159 | B2 * | 2/2010 | Hwang et al. ............ | 365/185.19 |
| 2004/0264227 | A1 * | 12/2004 | Kojima et al. ................... | 365/45 |
| 2006/0164886 | A1 * | 7/2006 | Tanaka et al. ............ | 365/185.11 |
| 2007/0192627 | A1 * | 8/2007 | Oshikiri ........................ | 713/191 |

FOREIGN PATENT DOCUMENTS

| JP | 2000-105758 | 4/2000 |
|---|---|---|
| JP | 2000-112755 | 4/2000 |

* cited by examiner

*Primary Examiner* — Anh Phung
*Assistant Examiner* — Douglas King
(74) *Attorney, Agent, or Firm* — Morrison & Foerster LLP

(57) ABSTRACT

In the semiconductor integrated circuit incorporating non-volatile memory that is not electrically rewritable, updating stored data and reusing the non-volatile memory are made possible. The data stored in the non-volatile memory can be updated and the non-volatile memory can be reused by dividing the non-volatile memory into a plurality of blocks and replacing a used block with an unused block. When data "1" is set in the first flag of a certain block, a block selection circuit judges that data is already written in the block and rewriting new data into the block is not possible. To update the stored data, the updated data is written into a block that is selected by the block selection circuit out of the rest of the blocks. At that time, the first flag of the block is set to data "1". Stored data is updated one after another as described above. When data of final update is written into a certain block, the second flag of the block is set to data "1".

4 Claims, 4 Drawing Sheets

FIG.4A  INITIAL STATE

| | |
|---|---|
| 1A --- 0 | 0 --- 1B |
| 2A --- 0 | 0 --- 2B |
| 3A --- 0 | 0 --- 3B |
| 4A --- 0 | 0 --- 4B |
| 5A --- 0 | 0 --- 5B |

FIG.4B  AFTER WRITING DATA INTO FIRST BLOCK

| | |
|---|---|
| 1A --- 1 | 0 --- 1B |
| 2A --- 0 | 0 --- 2B |
| 3A --- 0 | 0 --- 3B |
| 4A --- 0 | 0 --- 4B |
| 5A --- 0 | 0 --- 5B |

FIG.4C  FINAL STATE (EXAMPLE)

| | |
|---|---|
| 1A --- 1 | 0 --- 1B |
| 2A --- 1 | 1 --- 2B |
| 3A --- 1 | 0 --- 3B |
| 4A --- 0 | 0 --- 4B |
| 5A --- 0 | 0 --- 5B |

SEMICONDUCTOR INTEGRATED CIRCUIT

CROSS-REFERENCE OF THE INVENTION

This application claims priority from Japanese Patent Application No. 2007-247593, the content of which is incorporated herein by reference in its entirety.

BACKGROUND OF THE INVENTION

1. Field of the Invention

This invention relates to a semiconductor integrated circuit that incorporates a non-volatile memory.

2. Description of the Related Art

There has been known a semiconductor integrated circuit (a microcomputer, for example) that incorporates a non-volatile memory as a data memory or a program memory. A mask ROM (Read-Only Memory), a UV (ultraviolet ray) erasable EPROM (Electrically Programmable ROM) and a flash memory that is electrically programmable and erasable are known as examples of the non-volatile memory.

In recent years, there has been developed a semiconductor integrated circuit that incorporates a small capacity non-volatile memory in order to store data such as trimming data of an internal circuit incorporated in the semiconductor integrated circuit or an identification code of the semiconductor integrated circuit.

Information on a semiconductor integrated circuit that incorporates a flash memory may be found in Japanese Patent Application Publication Nos. 2000-112755 and 2000-105758, for example.

When rewriting the data such as the trimming data of the internal circuit or the identification code stored in the small capacity non-volatile memory incorporated in the semiconductor integrated circuit is required, it is necessary to use an electrically rewritable memory (a flash memory, for example) as the non-volatile memory.

However, using the flash memory increases the cost of the semiconductor integrated circuit, albeit only small capacity of non-volatile memory required for the purpose.

On the other hand, an electrically non-rewritable non-volatile memory, although less expensive, has a problem that the data once stored in the memory can be not updated and the non-volatile memory can be not reused.

SUMMARY OF THE INVENTION

The invention provides a semiconductor integrated circuit that includes a plurality of non-volatile memory blocks. Each of the blocks includes non-volatile memory cells in which data can be written only once. The circuit also includes a first flag memory provided for each of the blocks so as to store a first flag that indicates whether data is written into that block, and a block selection circuit configured to select a non-volatile memory block into which data is not written based on the first flag.

BRIEF DESCRIPTION OF THE DRAWINGS

FIGS. 4A, 4B and 4C show an example of usage of the semiconductor integrated circuit according to the embodiment of this invention.

DETAILED DESCRIPTION OF THE INVENTION

Figure 1:
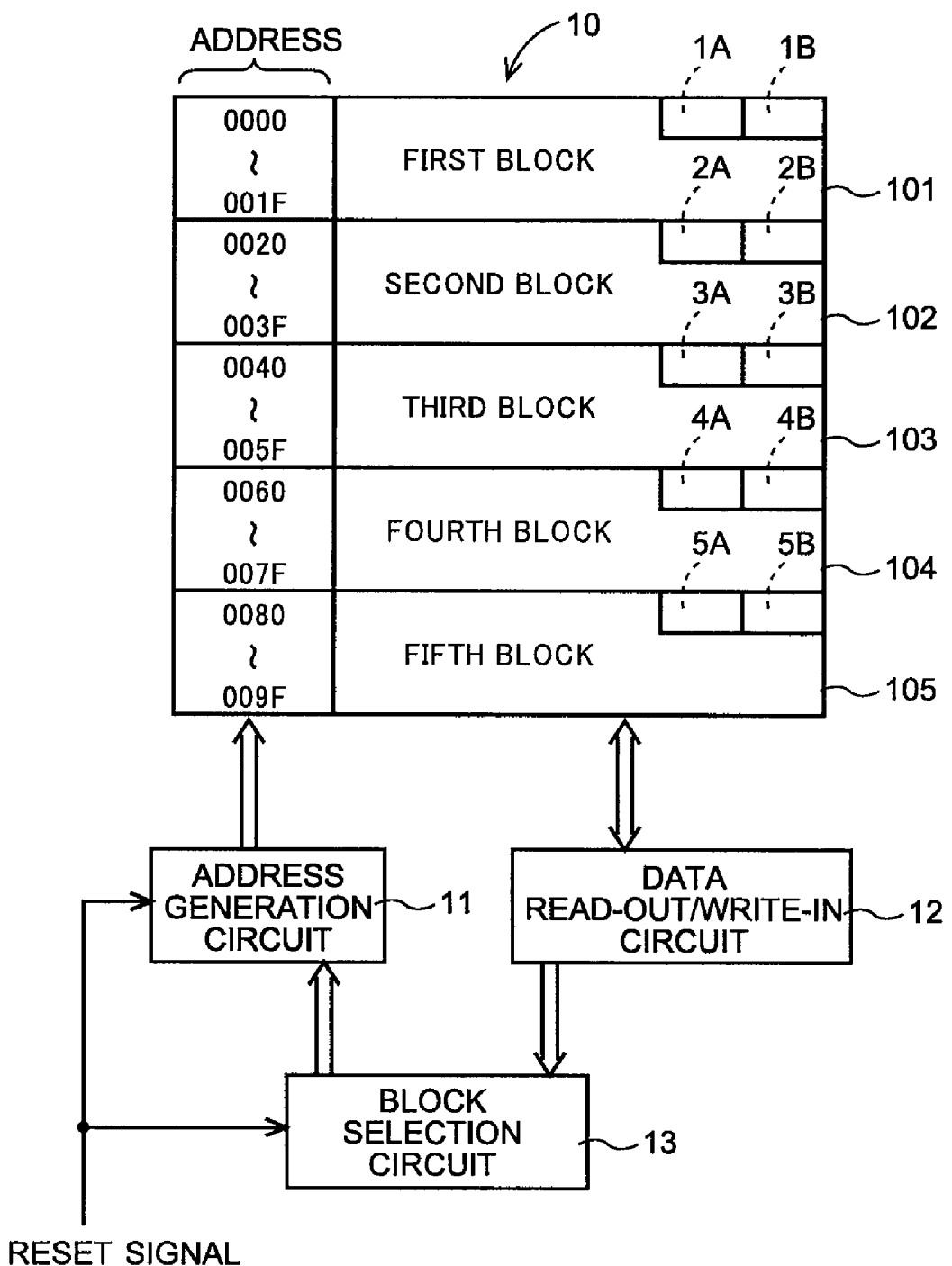
FIG. 1 shows a structure of a semiconductor integrated circuit according to an embodiment of this invention.

A semiconductor integrated circuit according to an embodiment of this invention will be described referring to the drawings. FIG. 1 shows a structure of the semiconductor integrated circuit according to the embodiment of this invention. Although FIG. 1 shows only a non-volatile memory incorporated in the semiconductor integrated circuit, the semiconductor integrated circuit incorporates internal circuits (a CPU (Central Processing Unit), an oscillation circuit, an input/output circuit and the like in the case of a microcomputer, for example) in addition to the non-volatile memory.

The non-volatile memory is provided with a non-volatile memory area 10 in which the data is written and retained semi-permanently, an address generation circuit 11, a data read-out/write-in circuit 12 and a block selection circuit 13.

First, an example structure of the non-volatile memory area 10 is described. The non-volatile memory area 10 is divided into five blocks that are a first block 101 through a fifth block 105. Addresses different from each other are sequentially assigned to the five blocks. In this example, addresses 0000-001F are assigned to the first block 101, addresses 0020-003F are assigned to the second block 102, addresses 0040-005F are assigned to the third block 103, addresses 0060-007F are assigned to the fourth block 104 and addresses 0080-009F are assigned to the fifth block 105.

Each of the first through fifth blocks 101-105 is provided as a part of the block with corresponding each of first flag memory areas 1A-5A, in each of which a first flag (re-writing prohibit flag) that indicates whether the data has been written into the corresponding block and rewriting is prohibited is stored and corresponding each of second flag memory areas 1B-5B, in each of which a second flag that indicates whether finally updated data has been written into the corresponding block is stored.

Remaining memory areas in the first through fifth blocks 101-105 are data memory areas to store trimming data of an internal circuit incorporated in the semiconductor integrated circuit or an identification code of the semiconductor integrated circuit. Structuring the memory areas as described above eliminates a need of a dedicated register to store the first flags and the second flags and reduces a size of the semiconductor integrated circuit.

Each of the first flag memory areas 1A-5A and the second flag memory areas 1B-5B is composed of one bit, for example. Data "1" set in the first flag indicates that the data has been written into the corresponding block and rewriting is impossible, while data "0" set in the first flag indicates that the data has not been written into the corresponding block yet and writing is possible. Data "1" set in the second flag indicates that finally updated data has been written into the corresponding block, while data "0" set in the second flag indicates that the finally updated data has not been written into the corresponding block yet.

Figure 2A:
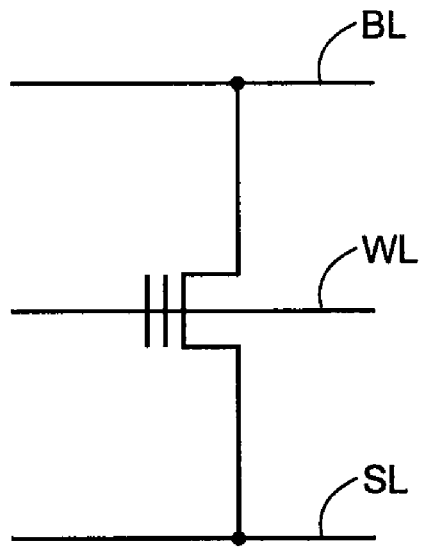
FIGS. 2A and 2B show a structure of a memory cell of a non-volatile memory.
Figure 2B:
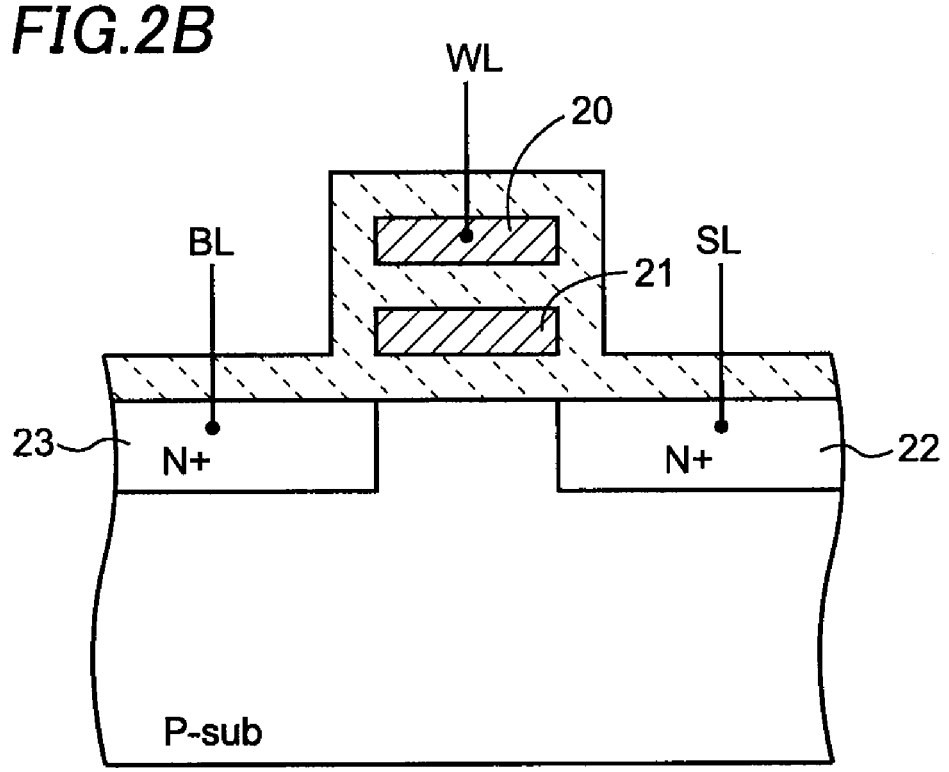

FIGS. 2A and 2B show a structure of each of memory cells in the first through fifth blocks 101-105. FIG. 2A is a circuit diagram of the memory cell. FIG. 2B is a cross-sectional view of the memory cell. The memory cell has a control gate 20, a floating gate 21, an N+-type source 22 and an N+-type drain 23. The control gate 20 is connected to a word line WL, the source 22 is connected to a source line SL and the drain 23 is connected to a bit line BL. A channel current is caused by applying an H (high) level voltage to the word line WL and applying a high voltage to the bit line BL. Data can be stored into the memory cell by injecting electric charges taken from a portion of the channel current into the floating gate 21.

However, electrically rewriting the data is not possible because the memory cell is provided with neither a device structure nor a peripheral circuit necessary to remove the injected charges from the floating gate 21 to erase the data. Although some non-volatile memories are erasable by ultraviolet ray, they are not erasable by any means after the semiconductor integrated circuit is packaged in an opaque package. That is, writing the data into the non-volatile memory can be made only once. This type of non-volatile memory is called one time ROM.

The data read-out/write-in circuit 12 reads/writes the data (including the first and second flags) out of/into the data memory areas, the first flag memory areas 1A-5A or the second flag memory areas 1B-5B at an address specified by the address generation circuit 11. The block selection circuit 13 selects a particular block out of the first through fifth blocks 101-105 based on the first flag or the second flag read out by the data read-out/write-in circuit 12.

The selection is carried out by that the block selection circuit 13 outputs a block selection signal based on the first flag or the second flag and that the address generation circuit 11 generates an address corresponding to the selected block upon receipt of the block selection signal.

According to the embodiment of this invention, as described above, the data stored in the non-volatile memory can be updated and the non-volatile memory can be reused by dividing the non-volatile memory into a plurality of blocks and replacing a used block with an unused block. The first and second flags are used for that purpose. That is, when data "1" is set in the first flag of a certain block, the block selection circuit 13 judges that data is already written in the block and rewriting into the block is not possible.

Thus, in order to update the stored data, the block selection circuit 13 selects one of the other blocks having the first flag set to data "0" (usually a block of a lowest address among blocks into which data has not been written yet) and writes the updated data into the selected block. At that time, the first flag of the block is set to data "1". Stored data is updated one after another as described above. When data of final update is written into a certain block, the second flag of the block is set to data "1".

When the data is read out, the data read-out/write-in circuit 12 reads the second flag of each of the blocks one after another. And the block selection circuit 13 judges which block has the second flag that is set to data "1". With this, the block that has the second flag set to data "1" (that is, the block in which the data of final update is written) is selected, and the data read out of the block is utilized as the trimming data of the internal circuit or the identification code. In other words, the block selection circuit 13 selects the block to be used based on the second flag.

It is preferable that the block selection circuit 13 makes the selection based on a reset signal of the semiconductor integrated circuit (a reset signal of a microcomputer, for example).

Figure 3:
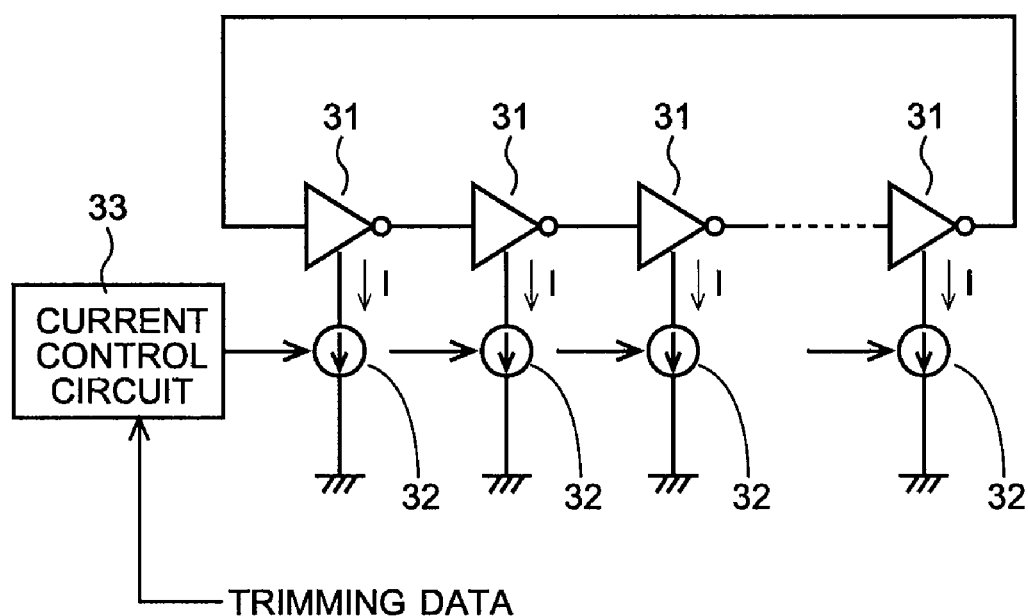
FIG. 3 shows a structure of an oscillation circuit.

Next, there is described how the trimming data of the internal circuit stored in the non-volatile memory is used, taking an oscillation circuit as an example. FIG. 3 shows a structure of the oscillation circuit. The oscillation circuit is a ring oscillator composed of odd number of inverters 31 and constant current sources 32 each connected to and providing each of the inverters 31 with an operation current. There is provided a current control circuit 33 to control a current value I of the current generated by each of the constant current sources 32. The trimming data read out of the non-volatile memory is inputted to the current control circuit 33 that generates the current of the current value I corresponding to the trimming data.

When the current value I increases, an oscillation frequency of the ring oscillator increases as the operation current of each of the inverters 31 increases. When the current value I decreases, the oscillation frequency of the ring oscillator decreases as the operation current of each of the inverters 31 decreases. As described above, the oscillation frequency can be trimmed by adjusting the current value I of each of the constant current sources 32.

An example of usage (operation) of the non-volatile memory is described hereafter taking an example of the trimming data of the oscillation circuit incorporated in an integrated circuit that is packaged already. As shown in FIG. 4A, no data is written in the non-volatile memory in an initial state. The first flags and the second flags of all the blocks are set to data "0" in this state.

Then, a first trimming data is written into the first block 101 at the lowest address and the first flag of the first block 101 is set to data "1", as shown In FIG. 4B. That is, the data "1" is written into the first flag memory area 1A that is provided in the first block 101. The first flag set to data "1" indicates that rewriting data into the first block 101 is impossible. Then, the first trimming data is read out by the data read-out/write-in circuit 12 and provided to the current control circuit 33 in the oscillation circuit. The oscillation circuit oscillates with the current value I that corresponds to the first trimming data, and the oscillation frequency is measured.

Next, a second trimming data is written into the second block 102 at a succeeding address, and the first flag of the second block 102 is set to data "1". The oscillation circuit oscillates with the current value I that corresponds to the second trimming data, and the oscillation frequency is measured in the same way as described above. Also, a third trimming data is written into the third block 103 at a succeeding address, and the first flag of the third block 103 is set to data "1". The oscillation circuit oscillates with the current value I that corresponds to the third trimming data, and the oscillation frequency is measured in the same way as described above.

If the second trimming data is judged as the most appropriate one (the oscillation frequency is adjusted to closest to a target frequency with the second trimming data) among the first through third trimming data after trial stages described above, the second flag of the second block 102 is set to data "1", as shown in FIG. 4C. That is, the data read-out/write-in circuit 12 writes the data "1" of the second flag into the second flag memory area 2B of the second block 102.

When the data is to be read out after that, the block selection circuit 13 looks for a block with the second flag set to data "1", and selects the second block 102 as a result. With this, the second trimming data is read out from the second block 102 and used as the trimming data for the oscillation circuit.

It should be noted that the operation of the non-volatile memory described above is only an example. The embodiment of this invention is not limited to the above and may be modified variously. For example, if the first trimming data that is written into the first block 101 as shown in FIG. 4B is judged as the most appropriate one, the second flag of the first block 101 may be set to data "1" without further writing the second or third trimming data.

When the second flag of any of the blocks is not set to data "1", the block selection circuit 13 selects a block having a highest address out of the blocks with the first flag set to data "1". For example, if the second flag is not set to data "1" in any of the blocks while the first flags are set to data "1" in the first through third blocks 101-103, the third block 103 (addresses: 0040-005F) that has the highest address among the first through third blocks 101-103 is selected as the block to be used.

Configuring as described above makes it possible that the block having the highest address is selected and the data written in the block is used as the trimming data or the like, even when no second flag is set to data "1". Since the blocks are accessed in ascending order of the addresses, the block into which data is written last makes the block having the highest address among the blocks with the first flag set to data "1". It is likely that the most appropriate data is written into such a block after a number of trials.

In the semiconductor integrated circuit incorporating non-volatile memory that is not rewritable, updating stored data and reusing the non-volatile memory are made possible with this invention. A cost can be reduced compared with the case in which an electrically rewritable memory such as a flash memory is used as the non-volatile memory.

What is claimed is:

1. A semiconductor integrated circuit comprising:
   a plurality of non-volatile memory blocks, each of the blocks comprising non-volatile memory cells in which data can be written only once;
   a first flag memory provided for each of the blocks to store a first flag that indicates whether data is written into a corresponding non-volatile memory block;
   a block selection circuit configured to select a non-volatile memory block into which data is not written based on the first flag; and
   a second flag memory provided for each of the blocks so as to store a second flag that indicates whether finally updated data is written into a corresponding non-volatile memory block,
   wherein the block selection circuit is configured to select for reading a non-volatile memory block based on the second flag.

2. The semiconductor integrated circuit of claim 1, wherein the block selection circuit is configured to select a block having a highest address among the blocks in which data is written, when none of the second flags of the blocks indicates that finally updated data is written.

3. The semiconductor integrated circuit of claim 1, wherein the first flag memory and the second flag memory are part of a corresponding non-volatile memory block.

4. The semiconductor integrated circuit of claim 3, wherein a memory cell of the first flag memory and a memory cell of the second flag memory have the same structure as the non-volatile memory cells of the blocks.

* * * * *